United States Patent
Li et al.

(10) Patent No.: US 9,946,109 B2
(45) Date of Patent: Apr. 17, 2018

(54) COLOR FILTER AND METHOD FOR PREPARING THE SAME, METHOD FOR PREPARING ALIGNMENT MARK FOR SPACER, AND METHOD FOR DETECTING POSITION ACCURACY

(71) Applicants: BOE TECHNOLOGY GROUP CO., LTD., Beijing (CN); BEIJING BOE DISPLAY TECHNOLOGY CO., LTD., Beijing (CN)

(72) Inventors: Min Li, Beijing (CN); Jingjing Jiang, Beijing (CN); Yu Xiao, Beijing (CN); Xiaoguang Li, Beijing (CN); Tonghua Yang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/036,352

(22) PCT Filed: Nov. 13, 2015

(86) PCT No.: PCT/CN2015/094555
§ 371 (c)(1),
(2) Date: May 12, 2016

(87) PCT Pub. No.: WO2016/192314
PCT Pub. Date: Dec. 8, 2016

(65) Prior Publication Data
US 2017/0102582 A1   Apr. 13, 2017

(30) Foreign Application Priority Data
Jun. 5, 2015   (CN) .......................... 2015 1 0303502

(51) Int. Cl.
*G02F 1/1335*   (2006.01)
*G02B 5/20*   (2006.01)
(Continued)

(52) U.S. Cl.
CPC ...... *G02F 1/133516* (2013.01); *G01B 11/272* (2013.01); *G02F 1/1309* (2013.01);
(Continued)

(58) Field of Classification Search
CPC ............ G03F 7/0007; G02F 1/133514; G02F 1/133516; G02F 1/1339; G02F 1/13394; G02B 5/223; G02B 5/201
(Continued)

(56) References Cited

U.S. PATENT DOCUMENTS 5,407,763 A   4/1995   Pai
5,978,061 A   11/1999  Miyazaki et al.
(Continued)

FOREIGN PATENT DOCUMENTS

CN   102346339 A   2/2012
CN   102809849 A   12/2012
(Continued)

OTHER PUBLICATIONS

Computer-generated translation of KR 2007-0078553 (Aug. 2007).*
(Continued)

*Primary Examiner* — John A McPherson
(74) *Attorney, Agent, or Firm* — Harness, Dickey & Pierce, P.L.C.

(57) ABSTRACT

The present application discloses a color filter, comprising: a substrate; a black matrix layer formed on the substrate; color film layers formed on at least one first sub-pixel opening area and a plurality of second sub-pixel opening areas on the substrate; wherein the size of the first sub-pixel
(Continued)

opening area is smaller than the size of the second sub-pixel opening area; the size of the color film layer on the first sub-pixel opening area is smaller than the size of the color film layer on the second sub-pixel opening area; a flat layer formed on the color film layer; an alignment mark formed on the flat layer and located at a designated position around the first sub-pixel opening area; a spacer layer formed on the flat layer.

18 Claims, 5 Drawing Sheets

(51) Int. Cl.
| | | |
|---|---|---|
| *G02F 1/1339* | (2006.01) | |
| *G02F 1/13* | (2006.01) | |
| *G01B 11/27* | (2006.01) | |
| *G03F 7/00* | (2006.01) | |
| *G02F 1/1333* | (2006.01) | |

(52) U.S. Cl.
CPC ........ *G02F 1/1339* (2013.01); *G02F 1/13394* (2013.01); *G02F 1/133512* (2013.01); *G02F 1/133514* (2013.01); *G03F 7/0007* (2013.01); *G02F 2001/133354* (2013.01); *G02F 2001/133519* (2013.01)

(58) Field of Classification Search
USPC ...................................... 430/7; 349/106, 156
See application file for complete search history.

(56) References Cited

U.S. PATENT DOCUMENTS

| | | | |
|---|---|---|---|
| 7,466,412 B2 | 12/2008 | Fujita | |
| 2004/0196421 A1 | 10/2004 | Hwang | |
| 2006/0092372 A1 | 5/2006 | Kim et al. | |
| 2008/0014511 A1 | 1/2008 | Yoo et al. | |
| 2008/0032205 A1 | 2/2008 | Chiu et al. | |
| 2008/0186435 A1* | 8/2008 | Son ................... | G02F 1/13394 349/106 |
| 2012/0019748 A1 | 1/2012 | Kim et al. | |
| 2015/0285968 A1 | 10/2015 | Zha et al. | |
| 2015/0309221 A1 | 10/2015 | Li et al. | |

FOREIGN PATENT DOCUMENTS

| | | |
|---|---|---|
| CN | 103185981 A | 7/2013 |
| CN | 103268037 A | 8/2013 |
| CN | 103383503 A | 11/2013 |
| CN | 203337948 U | 12/2013 |
| CN | 103605263 A | 2/2014 |
| CN | 103645582 A | 3/2014 |
| CN | 103676293 A | 3/2014 |
| CN | 104849901 A | 8/2015 |
| JP | 5453723 B2 | 3/2014 |
| KR | 2007-0078553 A * | 8/2007 |

OTHER PUBLICATIONS

Written Opinion of the International Searching Authority from corresponding PCT Application No. PCT/CN2015/094555 (6 pages).
Office Action from corresponding Chinese Application No. 201510303502.6, dated May 11, 2017 (9 pages).

* cited by examiner

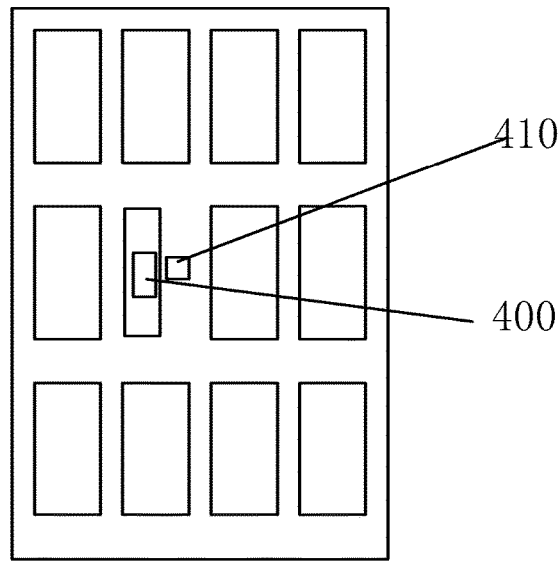

FIG. 4D

| in the fabrication of a black matrix layer of a color filter, forming at least one first sub-pixel opening area and a plurality of second sub-pixel opening areas on a substrate, wherein the size of the first sub-pixel opening area is smaller than the size of the second sub-pixel opening area; | 501 |

| in the fabrication of a spacer layer, fabricating an alignment mark for the spacer layer at a designated positon around the first sub-pixel opening area. | 502 |

FIG. 5

COLOR FILTER AND METHOD FOR PREPARING THE SAME, METHOD FOR PREPARING ALIGNMENT MARK FOR SPACER, AND METHOD FOR DETECTING POSITION ACCURACY

CROSS REFERENCES TO RELATED APPLICATIONS

This patent application claims priority of Chinese Patent Application No. 201510303502.6, filed on Jun. 5, 2015, the entire content of which is incorporated by reference herein.

FIELD OF THE INVENTION

Embodiments of the present invention relate to a color filter and method for preparing the same, method for preparing alignment mark for spacer, and method for detecting position accuracy.

BACKGROUND

Color filter is an important part of liquid crystal technology. The structure of color filter mainly includes a substrate, a black matrix (BM), a color film layer, a protective film layer (i.e., a flat layer) and a spacer film layer. Currently a color filter is still formed by proximity exposure process, position accuracy between film layers directly impacts on the quality of the color filter and even of the entire liquid crystal panel, in particular on the spacer layer, because in celling with TFT (Thin Film Transistor), its position often corresponds to the corresponding position of TFT, and there is a high demand for its accuracy. During operation, it is usually required to form an alignment mark through a mask plate in the formation of respective film layers as an alignment reference of automatic alignment between different film layers, between the spacer and the color filter as well as between the spacer and TFT. Generally, for a normal-size product (the size of a display area is smaller than the size of the mask plate), when exposed by each exposure unit, a group of alignment marks may be produced at its periphery (outside the display area) to precisely control the position accuracy of each member or film layer during each step. However, with the increase of the size of the product, there are more and more applications of splicing exposure techniques. For a supersized product (the size of the display area is larger than the size of the mask plate), the fabrication of its display area often needs to be completed by splicing exposure of a plurality of exposure units. Since the size of the mask plate is smaller than the size of the display area, it is not possible to produce the alignment mark located outside of the display area when exposed by each exposure unit. Therefore, it is not possible to precisely control the position accuracy of each member or film layer during each step, especially the position accuracy of the spacer. Moreover, when a position deviation (observed microscopically) occurs, it is not possible to measure in time and quickly compensate the position deviation.

BRIEF SUMMARY OF THE DISCLOSURE

Embodiments of the present invention provide a method for preparing an alignment mark for a spacer and a method for detecting position accuracy, a color filter and a method for preparing the same.

According to one embodiment of the present invention, there is provided a method for preparing an alignment mark for a spacer, said method comprising:
in the fabrication of a black matrix layer of a color filter, forming at least one first sub-pixel opening area and a plurality of second sub-pixel opening areas on a substrate, wherein the size of the first sub-pixel opening area is smaller than the size of the second sub-pixel opening area;
in the fabrication of a spacer layer, fabricating an alignment mark for the spacer layer at a designated position around the first sub-pixel opening area.

In one example, the method further comprises:
forming color film layers on the first sub-pixel opening area and the second sub-pixel opening areas respectively, wherein the size of the color film layer on the first sub-pixel opening area is smaller than the size of the color film layer on the second sub-pixel opening area;
preparing a flat layer on the color film layer;
the fabrication of the spacer layer comprising:
fabricating the spacer layer on the flat layer.

According to one embodiment of the present invention, there is further provided a method for detecting the position accuracy of a spacer, comprising:
acquiring at least one first sub-pixel opening area formed on a substrate and an alignment mark formed at a designated position around the first sub-pixel opening area, wherein the size of the first sub-pixel opening area is smaller than the size of the plurality of second sub-pixel opening areas formed on the substrate, and the first sub-pixel opening area and the second sub-pixel opening areas are formed in the fabrication of a black matrix layer of a color filter;
calculating a position difference between the first sub-pixel opening area and the alignment mark;
calculating the position accuracy of the spacer according to the position difference.

According to one embodiment of the present invention, there is further provided a color filter, comprising:
a substrate;
a black matrix layer formed on the substrate;
color film layers formed on at least one first sub-pixel opening area and a plurality of second sub-pixel opening areas on the substrate; wherein the size of the first sub-pixel opening area is smaller than the size of the second sub-pixel opening area; the size of the color film layer on the first sub-pixel opening area is smaller than the size of the color film layer on the second sub-pixel opening area;
a flat layer formed on the color film layer;
an alignment mark formed on the flat layer and located at a designated position around the first sub-pixel opening area;
a spacer layer formed on the flat layer.

According to one embodiment of the present invention, there is further provided a liquid crystal panel, comprising said color filter of the above described embodiments or embodiments described herein.

According to one embodiment of the present invention, there is further provided a method for preparing a color filter, comprising:
providing a substrate;
forming a black matrix layer on the substrate, and forming at least one first sub-pixel opening area and a plurality of second sub-pixel opening areas, wherein the size of the first sub-pixel opening area is smaller than the size of the second sub-pixel opening area;
forming color film layers on the first sub-pixel opening area and the second sub-pixel opening areas; wherein the size of the color film layer on the first sub-pixel opening area is smaller than the size of the color film layer on the second sub-pixel opening area;

forming a flat layer on the color film layer;

forming an alignment mark and a spacer layer on the flat layer, the alignment mark being located at a designated position around the first sub-pixel opening area.

In the technical solution provided by the embodiments of the present invention, by providing a small-size sub-pixel opening area, and subsequently providing an alignment mark near the sub-pixel opening areas, in the fabrication process of the display panel, the alignment of position of the spacer may be facilitated and the detection of position accuracy of the spacer can be achieved, thereby achieving precise control of the position accuracy between layers.

BRIEF DESCRIPTION OF THE DRAWINGS

In order to more clearly illustrate the technical solution in the embodiments of the present invention, drawings to be used in the embodiments described herein will be briefly introduced below. Apparently, the drawings in the following description are only for some embodiments of the present invention, and those of ordinary skill in the art may also obtain other drawings according to these drawings, without creative efforts.

FIGS. 4A-4D are schematic views of relative positions between a first sub-pixel opening area 400 and an alignment mark 410;

FIG. 5 is a flowchart of a method for preparing an alignment mark for a spacer provided according to another embodiment of the present invention;

DETAILED DESCRIPTION

Figure 1:
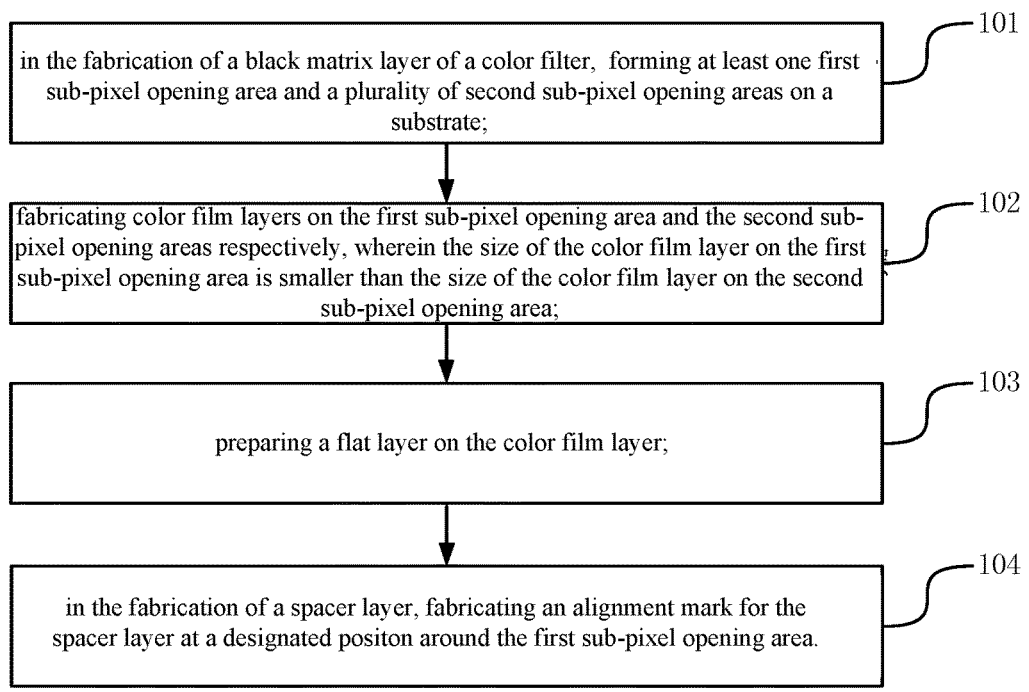
FIG. 1 is a flowchart of a method for preparing an alignment mark for a spacer provided according to an embodiment of the present invention.

To make the purpose, technical solutions, and advantages of the present invention more clear, embodiments of the present invention will be further described below in detail in conjunction with the drawings. Obviously, the described embodiments are part of embodiments of the present invention, but not all embodiments. Based on the described embodiments of the present invention, all other embodiments obtained by those of ordinary skill in the art without creative work fall within the scope of protection sought for by the present invention.

In the description of the present invention, it should be noted that the orientation or position relationship indicated by terms "upper", "lower", "top", "bottom" and the like are based on the orientation or position relationship shown in the drawings, only for facilitating and simplifying the description of the present invention, rather than indicating or implying that the devices or elements indicated must have a specific orientation, be constructed and operated at the specific orientation, and thus cannot be construed as limiting the present invention.

Further, in the description of the present invention, unless otherwise specified, "a plurality of" means two or more.

FIG. 1 is a flowchart of a method for preparing an alignment mark for a spacer provided according to an embodiment of the present invention. Referring to FIG. 1, the method comprises the following steps.

S101. In the fabrication of a black matrix layer of a color filter, at least one first sub-pixel opening area and a plurality of second sub-pixel opening areas are formed on a substrate, wherein the size of the first sub-pixel opening area is smaller than the size of the second sub-pixel opening area.

Wherein, said first and second sub-pixel opening areas are used for forming sub-pixel display units thereon. It should be appreciated that three sub-pixel display units constitute one pixel display unit, that is, R, G, B together can constitute one pixel display unit. Therefore, in order to implement color display, it is required to leave an opening area for each sub-pixel display unit in the fabrication of the black matrix layer, that is, in the fabrication of the black matrix layer, areas on the substrate not covered by the black matrix layer form a plurality of sub-pixel opening areas. Among them, in order to facilitate the provision of an alignment mark and the detection of accuracy, sub-pixel opening areas of two sizes can be prepared (i.e., the first sub-pixel opening area and the second sub-pixel opening area), wherein the size of the first sub-pixel opening area is smaller than the size of the second sub-pixel opening area. Alternatively, the number of the first sub-pixel opening area may be only one in order to avoid an impact on the overall display effect. It should be appreciated that, when the size of the first sub-pixel opening area is set to be suitable, two or more first sub-pixel opening areas may also be prepared to fabricate a plurality of alignment marks. In this case, in the measurement of accuracy, an average may be taken to improve the measurement accuracy.

It should be noted that, in the fabrication process of a color filter, a substrate may be provided, to prepare a black matrix layer on the substrate. This specific fabrication process may be a process of exposure on the black matrix material based on a certain pattern, and will not be specifically defined in the embodiments disclosed herein.

Figure 2:
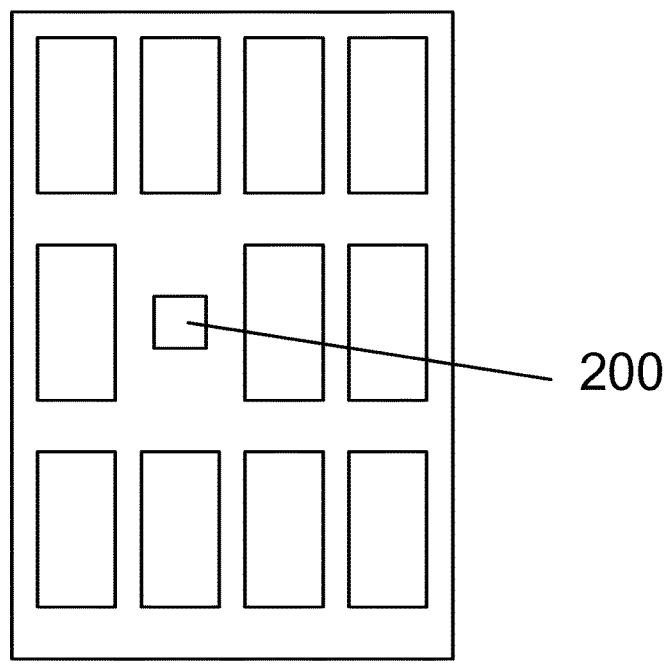
FIG. 2 is a schematic view of a first sub-pixel opening area 200 and second sub-pixel opening areas formed after the fabrication of a black matrix layer.

FIG. 2 is a schematic view of a first sub-pixel opening area 200 obtained after the fabrication of the black matrix layer. and second sub-pixel opening areas formed. Other larger-size rectangular opening areas are the second sub-pixel opening areas, these open areas exhibiting a transparent state after preparation whereas the area outside the opening areas is the black matrix layer area.

S102. color film layers are fabricated on the first sub-pixel opening area and the second sub-pixel opening areas respectively, wherein the size of the color film layer on the first sub-pixel opening area is smaller than the size of the color film layer on the second sub-pixel opening area.

The fabrication process of the color film layer may be coating photoresist on the required part on the black matrix layer or the substrate, and then applying an exposure and development using the mask plate to form the color film layer. In this process, the number of coating and the number of development may vary according to different product requirements and specific processes, and this will not be described herein in detail. In the exposure and development process, in order to leave free space for subsequent preparation of the alignment mark and make the subsequent preparation of the spacer layer not be affected by the position of the alignment mark, the mask plate may be aligned according to the first sub-pixel opening area provided in step 101 so as to determine the color film layer area that needs to be fabricated differentially in size.

It should be appreciated that the purpose to form the color film layer in this step is to form sub-pixel display units on the first sub-pixel opening area and on the second sub-pixel opening areas, thereby further form a pixel display unit.

In a possible embodiment of the present invention, the color film layers on the first sub-pixel opening area and on the second sub-pixel opening areas are any one of the R, G or B film layer.

Figure 3:
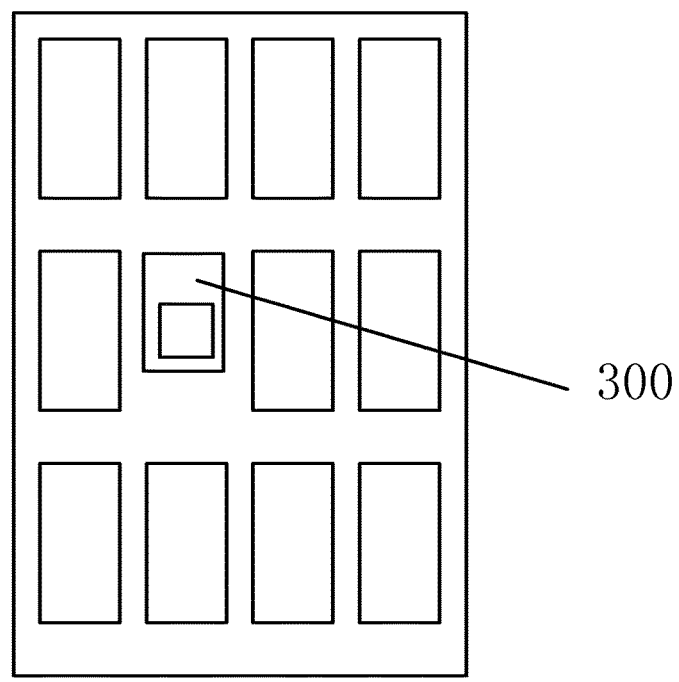
FIG. 3 is a schematic view of a color film layer RGB.

FIG. 3 is a schematic view of a color film layer RGB. The area 300 in the figure is the color film layer on the first sub-pixel opening area.

S103. A flat layer is prepared on the color film layer.

The flat layer is used for protecting the above layers and acts as a smoothing surface, as to this the present disclosure has no specific limitations.

S104. In the fabrication of the spacer layer, an alignment mark for the spacer layer is fabricated at a designated position around the first sub-pixel opening area.

It should be appreciated that, after the formation of the alignment mark, the position accuracy of the reference detection spacer layer relative to other layers (e.g., the black matrix layer) may be conveniently detected based on the alignment mark, so as to precisely control the relative position between layers (e.g., the black matrix layer and the spacer layer) inside a member and between members (e.g., a color filter and TFT).

As an alternative embodiment, the designated position around the first sub-pixel opening area is at a preset distance above or below the first sub-pixel opening area. It may be appreciated if the shape of the first sub-pixel opening area allows, it may also be at a preset distance to the left or right thereof.

Figure 4A:
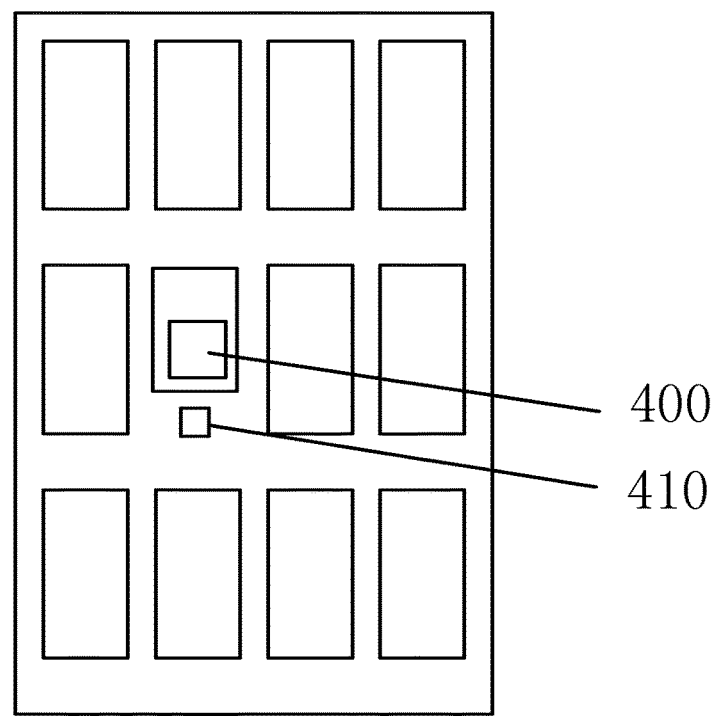
Figure 4B:
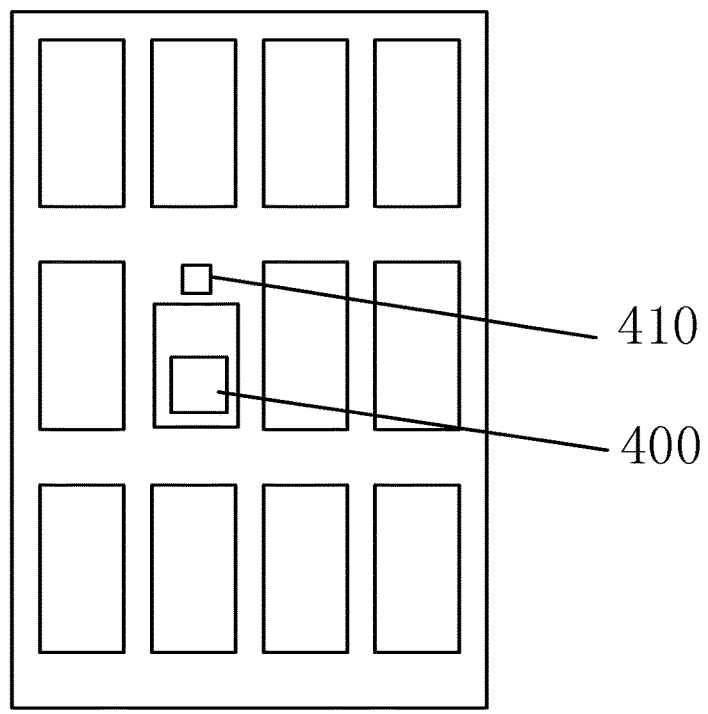
Figure 4C:
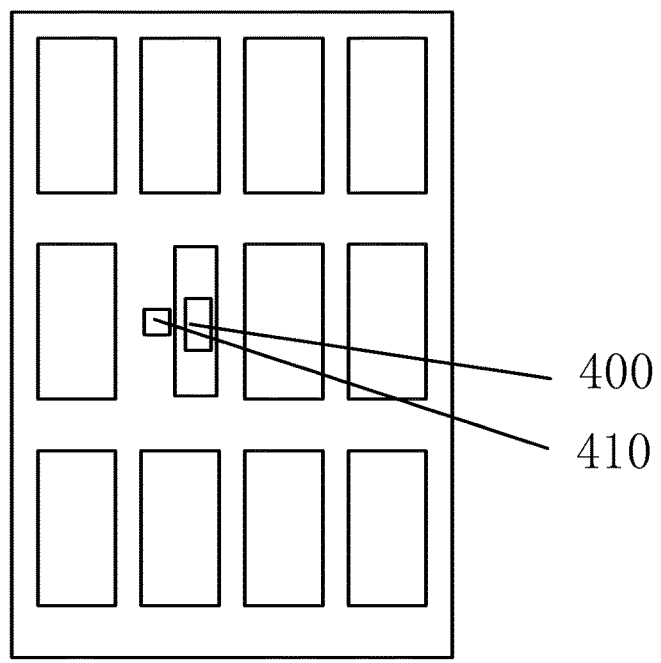

FIG. 4A is a schematic view of a relative position of a first sub-pixel opening area 400 to an alignment mark 410. In one embodiment of the present invention, the alignment mark 410 is located at a preset distance below the first sub-pixel opening area 400. FIG. 4B is a schematic view of another relative position of the first sub-pixel opening area 400 to the alignment mark 410. In one embodiment of the present invention, the alignment mark 410 is located at a preset distance above the first sub-pixel opening area 400. FIG. 4C is a schematic view of still another relative position of the first sub-pixel opening area 400 to the alignment mark 410. In one embodiment of the present invention, the alignment mark 410 is located at a preset distance of the left of the first sub-pixel opening area 400. FIG. 4D is a schematic view of still another relative position of the first sub-pixel opening area 400 to the alignment mark 410. In one embodiment of the present invention, the alignment mark 410 is located at a preset distance of the right of the first sub-pixel opening area 400.

In a possible embodiment of the present disclosure, the alignment mark has a square, circular or other shape. The alignment mark may employ any symmetric shape, such that the center position of the alignment mark may be determined based on at least three points.

All of the optional technical solutions above may be combined in any forms to form optional embodiments of the present invention, and will not be described herein any more.

FIG. 5 is a flowchart of a method for preparing an alignment mark for a spacer provided according to another embodiment of the present invention. Referring to FIG. 1, the method comprises the following steps.

S101. In the fabrication of a black matrix layer of a color filter, at least one first sub-pixel opening area and a plurality of second sub-pixel opening areas are formed on the substrate, wherein the size of the first sub-pixel opening area is smaller than the size of the second sub-pixel opening area;

S102. In the fabrication of a spacer layer, an alignment mark for the spacer layer is fabricated at a designated position around the first sub-pixel opening area.

It may be appreciated that, in the present embodiment, the step of preparing the alignment mark for the spacer may be carried out in the fabrication process of the color filter. In the fabrication process of the color filter, first, the black matrix layer, the first and second sub-pixel opening areas may be formed on the substrate; next the alignment mark is formed at the designated position around the first sub-pixel opening area; then the color film layer, flat layer and the like are sequentially formed. It should be appreciated that, in the process of forming the color film layer and the flat layer, these layers do not cover the alignment mark around the first sub-pixel opening area or are set to be transparent above the position where the alignment mark is located, so that the position accuracy of the spacer layer is subsequently detected referring to this alignment mark.

Figure 6:
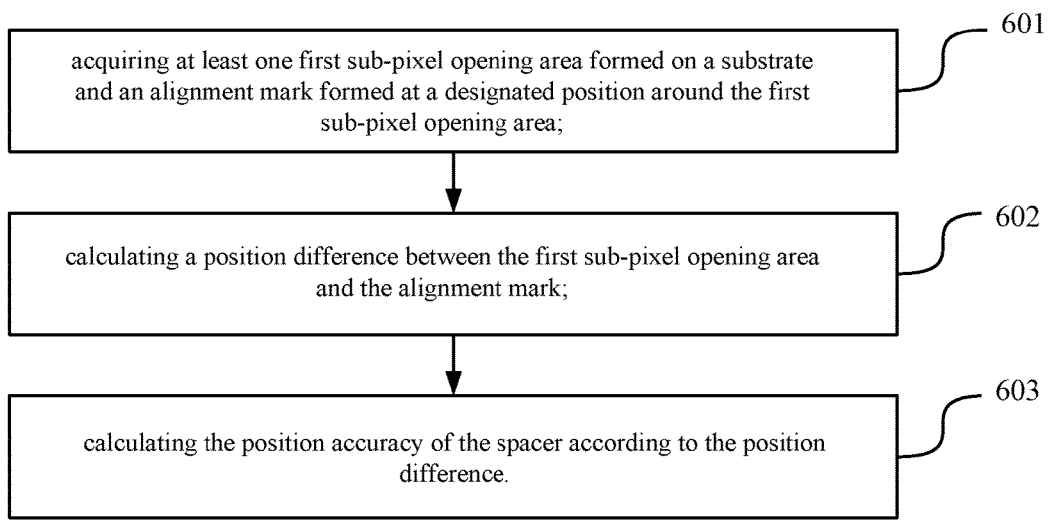
FIG. 6 is a flowchart of a method for detecting accuracy provided according to an embodiment of the present invention.

FIG. 6 is a flowchart of a method for detecting accuracy provided according to an embodiment of the present invention. The accuracy detection may be based on the alignment mark for the spacer provided by the method shown in FIG. 1 or FIG. 5 above. Referring to FIG. 6, the accuracy detection method comprises:

S601. acquiring at least one first sub-pixel opening area formed on a substrate and an alignment mark formed at a designated position around the first sub-pixel opening area, wherein the size of the first sub-pixel opening area is smaller than the size of the plurality of second sub-pixel opening areas formed on the substrate, and the first sub-pixel opening area and the second sub-pixel opening areas are formed during the fabrication of a black matrix layer of a color filter;

S602. calculating a position difference between the first sub-pixel opening area and the alignment mark;

S603. calculating the position accuracy of the spacer according to the position difference.

Specifically, the position accuracy of the spacer may be calculated according to the position difference and a preset design position difference. It should be appreciated that when there are a plurality of first sub-pixel opening areas, the position accuracy of the spacer may be calculated according to the average of position differences between the plurality of first sub-pixel opening areas and the corresponding position mark.

In the above process, by measuring a first sub-pixel opening area (formed in the BM process step) and an alignment mark, and calculating the position difference between the both, the position accuracy of the spacer PS (with respect to the BM layer) is characterized according to the numerical relationship or proportional relationship between the position difference after a plurality of steps and the ideal design position difference, to achieve the precise control on the position accuracy between layers, prevent related adverse occurrence and improve the screen display quality of the supersized product.

All of the above optional technical solutions may be combined in any forms to form optional embodiments of the present disclosure and will not be described any more.

Alternatively, the color film layers on the first sub-pixel opening area and on the second sub-pixel opening areas are any one of the R, G or B film layer.

Alternatively, the designated position around the first sub-pixel opening area is any of the positions at a preset distance above, below, to the left of, and to the right of the first sub-pixel opening area.

Alternatively, the alignment mark has a symmetric shape, and optionally has a square, circular or other shape.

Alternatively, calculating the position difference between the first sub-pixel opening area and the alignment mark comprises:

determining the center position of the first sub-pixel opening area according to the acquired vertex positions of the first sub-pixel opening area;

determining the center position of the alignment mark according to the acquired vertex positions of the alignment mark;

calculating the position difference between the center position of the first sub-pixel opening area and the center position of the alignment mark.

Alternatively, calculating the position accuracy of the spacer according to the position difference comprises:

according to the position difference and a preset design position difference, calculating the position accuracy of the spacer.

The embodiment of the present disclosure further provides a color filter, comprising: a substrate, a black matrix, color film layers, a flat layer and a spacer film layer.

The black matrix layer is formed on the substrate. The color film layer is formed on at least one first sub-pixel opening area and a plurality of second sub-pixel opening areas on the substrate; wherein the size of the first sub-pixel opening area on the substrate is smaller than the size of the second sub-pixel opening area; the size of the color film layer on the first sub-pixel opening area is smaller than the size of the color film layer on the second sub-pixel opening area. The flat layer is formed on the color film layer. an alignment mark is formed on the flat layer and located at a designated position around the first sub-pixel opening area. The spacer layer is formed on the flat layer.

Alternatively, the color film layers on the first sub-pixel opening area and on the second sub-pixel opening areas are any one of the R, G or B film layer.

Alternatively, the first sub-pixel opening area and the second sub-pixel opening areas are located at areas not covered by the black matrix on the substrate.

Alternatively, the designated position around the first sub-pixel opening area is any of the positions at a preset distance above, below, to the left of, and to the right of the first sub-pixel opening area.

Alternatively, the alignment mark has a square, circular or other shape.

All of the above optional technical solutions may be combined in any forms to form optional embodiments of the present disclosure and will not be described any more.

In the color filter disclosed by the embodiments described herein, with the spacer being provide near the first sub-pixel opening area having small-size, it is possible to detect the position accuracy of the spacer in time and make a correction according to the detection result in the fabrication process of the large-size liquid crystal display panel, thereby achieving accurate alignment between the color filter and other members of the liquid crystal display panel and increasing product yield rate.

The embodiment of the present disclosure further provides a liquid crystal panel comprising the color filter of any of the above described embodiments or embodiments described herein.

The embodiment of the present disclosure further provides a method for preparing a color filter, comprising:

providing a substrate;

forming a black matrix layer on the substrate, and forming at least one first sub-pixel opening area and a plurality of second sub-pixel opening areas, wherein the size of the first sub-pixel opening area is smaller than the size of the second sub-pixel opening area;

forming color film layers on the first sub-pixel opening area and the second sub-pixel opening areas; wherein the size of the color film layer on the first sub-pixel opening area is smaller than the size of the color film layer on the second sub-pixel opening area;

forming a flat layer on the color film layer;

forming an alignment mark and a spacer layer on the flat layer, the alignment mark being located at a designated position around the first sub-pixel opening area.

In the method for preparing a color filter disclosed in the present embodiment, with the spacer being provide near the first sub-pixel opening area having small-size, it is possible to detect the position accuracy of the spacer in time and make a correction according to the detection result in the fabrication process of the large-size liquid crystal display panel, thereby achieving accurate alignment between the color filter and other member of the liquid crystal display panel and increasing product yield rate.

All of the above optional technical solutions may be combined in any forms to form optional embodiments of the present disclosure and will not be described any more.

Those of ordinary skill may understand that all or part of the steps of the above-described embodiments may be accomplished by hardware, and may also be accomplished by a program instructing relevant hardware, while the program may be stored in a computer readable storage medium, which may be a read-only memory, magnetic or optical disk.

The foregoing is only about preferred embodiments of the present invention and is not intended to limit the present invention. Any alterations, equivalent substitutions and improvements made within the spirit and principle of the present invention should be included within the scope of protection of the present invention.

What is claimed is:

1. A color filter, comprising:
   a substrate;
   a black matrix layer formed on the substrate;
   color film layers formed on at least one first sub-pixel opening area and a plurality of second sub-pixel opening areas on the substrate; wherein the size of the first sub-pixel opening area is smaller than the size of the second sub-pixel opening area; the size of the color film layer on the first sub-pixel opening area is smaller than the size of the color film layer on the second sub-pixel opening area;
   a flat layer formed on the color film layer;
   an alignment mark formed on the flat layer and located at a designated position around the first sub-pixel opening area;
   a spacer layer formed on the flat layer.

2. The color filter according to claim 1, wherein the color film layers on the first sub-pixel opening area and on the second sub-pixel opening areas are any one of R, G and B film layer.

3. The color filter according to claim 1, wherein the designated position around the first sub-pixel opening area is any one of the positions at a preset distance above, below, to the left of, and to the right of the first sub-pixel opening area.

4. The color filter according to claim 1, wherein the alignment mark has a square or circular shape.

5. A liquid crystal panel comprising the color filter according to claim 1.

6. A method for preparing the color filter of claim 1, the method, comprising:

providing a substrate;

forming a black matrix layer on the substrate, and forming at least one first sub-pixel opening area and a plurality of second sub-pixel opening areas, wherein the size of the first sub-pixel opening area is smaller than the size of the second sub-pixel opening area;

forming color film layers on the first sub-pixel opening area and the second sub-pixel opening areas; wherein the size of the color film layer on the first sub-pixel opening area is smaller than the size of the color film layer on the second sub-pixel opening area;

forming a flat layer on the color film layer;

forming an alignment mark and a spacer layer on the flat layer, the alignment mark being located at a designated position around the first sub-pixel opening area.

7. A method for preparing an alignment mark for a spacer, the method comprising:

in the fabrication of a black matrix layer of a color filter, forming at least one first sub-pixel opening area and a plurality of second sub-pixel opening areas on a substrate, a size of the first sub-pixel opening area smaller than a size of each of the second sub-pixel opening areas;

forming color film layers on the first sub-pixel opening area and the second sub-pixel opening areas respectively, a size of the color film layer on the first sub-pixel opening area smaller than a size of the color film layer on the second sub-pixel opening areas;

preparing a flat layer on the color film layers; and in the fabrication of a spacer layer, fabricating an alignment mark for the spacer layer at a designated position around the first sub-pixel opening area, fabrication of the spacer layer comprising fabricating the spacer layer on the flat layer.

8. The method according to claim 7, wherein the color film layers on the first sub-pixel opening area and on the second sub-pixel opening areas are any one of R, G and B film layers.

9. The method according to claim 7, wherein the first sub-pixel opening area and the second sub-pixel opening areas are located at areas not covered by the black matrix on the substrate.

10. The method according to claim 7, wherein the designated position around the first sub-pixel opening area is any one of positions at a preset distance above, below, to the left of, and to the right of the first sub-pixel opening area.

11. The method according to claim 7, wherein the alignment mark has a symmetric shape.

12. The method according to claim 11, wherein the alignment identifier has a square or circular shape.

13. A method for detecting a position accuracy of a spacer, the method comprising:

acquiring at least one first sub-pixel opening area formed on a substrate and an alignment mark formed at a designated position around the first sub-pixel opening area, a size of the first sub-pixel opening area smaller than a size of each of a plurality of second sub-pixel opening areas formed on the substrate, the first sub-pixel opening area and the second sub-pixel opening areas formed in the fabrication of a black matrix layer of a color filter, color film layers formed on the first sub-pixel opening area and the second sub-pixel opening areas respectively, a size of the color film layer on the first sub-pixel opening area smaller than a size of the color film layer on the second sub-pixel opening areas, a flat layer formed on the color film layers, and the spacer layer fabricated on the flat layer;

calculating a position difference between the first sub-pixel opening area and the alignment mark; and calculating a position accuracy of the spacer according to the position difference.

14. The method according to claim 13, wherein the color film layers on the first sub-pixel opening area and on the second sub-pixel opening areas are any one of R, G and B film layers.

15. The method according to claim 13, wherein the designated position around the first sub-pixel opening area is any one of positions at a preset distance above, below, to the left of, and to the right of the first sub-pixel opening area.

16. The method according to claim 13, wherein the alignment mark has a square or circular shape.

17. The method according to claim 13, wherein calculating the position difference between the first sub-pixel opening area and the alignment mark comprises:

determining a center position of the first sub-pixel opening area according to an acquired vertex position of the first sub-pixel opening area;

determining a center position of the alignment mark according to an acquired vertex position of the alignment mark;

calculating the position difference between the center position of the first sub-pixel opening area and the center position of the alignment mark.

18. The method according to claim 13, wherein calculating the position accuracy of the spacer according to the position difference comprises:

according to the position difference and a preset design position difference, calculating the position accuracy of the spacer.

* * * * *